US012740413B2

(12) United States Patent
Spitzer et al.

(10) Patent No.: US 12,740,413 B2
(45) Date of Patent: Sep. 15, 2026

(54) ELECTRONIC DEVICE HAVING A SUPPLY TERMINAL AND A THERMAL BRIDGE

(71) Applicant: Infineon Technologies AG, Neubiberg (DE)

(72) Inventors: Dietmar Spitzer, Völkermarkt (AT); Tomas Reiter, Ottobrunn (DE)

(73) Assignee: Infineon Technologies AG, Neubiberg (DE)

(*) Notice: Subject to any disclaimer, the term of this patent is extended or adjusted under 35 U.S.C. 154(b) by 242 days.

(21) Appl. No.: 18/585,298

(22) Filed: Feb. 23, 2024

(65) Prior Publication Data

US 2025/0273533 A1 Aug. 28, 2025

(51) Int. Cl.

| | |
|---|---|
| ***H10W 40/25*** | (2026.01) |
| ***H10W 70/65*** | (2026.01) |
| ***H10W 76/12*** | (2026.01) |
| ***H10W 90/00*** | (2026.01) |

(52) U.S. Cl.

CPC ......... *H10W 40/258* (2026.01); *H10W 70/65* (2026.01); *H10W 76/161* (2026.01); *H10W 90/00* (2026.01); *H10W 90/701* (2026.01)

(58) Field of Classification Search

None

See application file for complete search history.

(56) References Cited

U.S. PATENT DOCUMENTS

| | | | |
|---|---|---|---|
| 7,095,099 B2 | 8/2006 | Oliver et al. | |
| 10,699,976 B1 | 6/2020 | Hoegerl et al. | |
| 11,075,185 B2 | 7/2021 | Hong et al. | |
| 11,075,785 B2 | 7/2021 | Bagheri et al. | |
| 11,815,533 B2 | 11/2023 | Houis | |
| 2008/0087992 A1 | 4/2008 | Shi et al. | |
| 2009/0072368 A1 | 3/2009 | Hu et al. | |
| 2013/0256856 A1 | 10/2013 | Mahler et al. | |
| 2014/0218885 A1 | 8/2014 | Hosseini et al. | |
| 2016/0014916 A1* | 1/2016 | Ausserlechner ..... | H05K 1/0203 361/699 |
| 2017/0117208 A1 | 4/2017 | Kasztelan et al. | |

(Continued)

FOREIGN PATENT DOCUMENTS

| | | |
|---|---|---|
| CN | 112447612 A | 3/2021 |
| DE | 102009054892 A1 | 7/2010 |

(Continued)

*Primary Examiner* — Kyoung Lee

(74) *Attorney, Agent, or Firm* — Murphy, Bilak & Homiller, PLLC

(57) ABSTRACT

An electronic device includes an enclosure, one or more power semiconductor dies within the enclosure, a supply terminal, and a thermal bridge. The supply terminal is electrically connected to the one or more power semiconductor dies and is at least partially exposed from the enclosure. The supply terminal extends lengthwise in a longitudinal direction and includes a constricted region where a width of the supply terminal reduces in a lateral direction transverse to the longitudinal direction. The thermal bridge is distinct from the enclosure. The thermal bridge bridges the constricted region and provides a thermal conduction path that is in parallel with a thermal conduction path of the supply terminal. The thermal bridge is non-magnetic and has a thermal conductivity that is higher than a thermal conductivity of the enclosure.

22 Claims, 8 Drawing Sheets

(56) References Cited

U.S. PATENT DOCUMENTS

| | | | |
|---|---|---|---|
| 2017/0317015 | A1 | 11/2017 | Lee et al. |
| 2018/0108600 | A1 | 4/2018 | Kamiyama |
| 2019/0385931 | A1 | 12/2019 | Eid et al. |
| 2020/0066546 | A1 | 2/2020 | Kawashima |
| 2020/0312750 | A1 | 10/2020 | Shirai et al. |
| 2021/0313243 | A1 | 10/2021 | Mcpherson |
| 2021/0384111 | A1 | 12/2021 | Voss et al. |
| 2022/0130773 | A1 | 4/2022 | Pun et al. |
| 2022/0149038 | A1 | 5/2022 | Fuergut et al. |
| 2022/0223544 | A1 | 7/2022 | Fukuoka et al. |
| 2023/0361009 | A1 | 11/2023 | Wang et al. |
| 2023/0378018 | A1 | 11/2023 | Okuda et al. |
| 2024/0087995 | A1 | 3/2024 | Otremba et al. |
| 2025/0054840 | A1 | 2/2025 | Grassmann |
| 2026/0157189 | A1 | 6/2026 | Liu et al. |

FOREIGN PATENT DOCUMENTS

| | | | |
|---|---|---|---|
| DE | 102013100156 | A1 | 7/2013 |
| DE | 112014004058 | T5 | 6/2016 |
| EP | 3522213 | A1 | 8/2019 |
| WO | 2013047671 | A1 | 4/2013 |
| WO | 2022226142 | A1 | 10/2022 |

* cited by examiner

ELECTRONIC DEVICE HAVING A SUPPLY TERMINAL AND A THERMAL BRIDGE

BACKGROUND

Demand for electronic components for power applications continues to increase rapidly across a wide range of industries, including automotive, consumer electronics, renewable energy, manufacturing, and medical, among many others. Developments in semiconductor materials such as silicon carbide (SiC) and gallium nitride (GaN) have enabled power electronic components with advantageous features such as smaller footprint, higher voltage and current capabilities, and faster switching speeds. As components become smaller and/or deliver higher currents, efficient heat dissipation becomes particularly important to ensuring acceptable reliability and lifetime. Additionally, many applications of these electronic components benefit from or even require monitoring of current during their operation using a sensor (e.g., a Hall sensor) built into the component. For some electronic component designs, there is a compromise between heat dissipation and the ability to accurately measure current. Thus, there is a need for a solution that enables current to be measured accurately without sacrificing efficient heat dissipation.

SUMMARY

According to an embodiment of an electronic device, the electronic device comprises: an enclosure; one or more power semiconductor dies within the enclosure; a supply terminal electrically connected to the one or more power semiconductor dies and at least partially exposed from the enclosure, the supply terminal extending lengthwise in a longitudinal direction and comprising a constricted region where a width of the supply terminal reduces in a lateral direction transverse to the longitudinal direction; and a thermal bridge distinct from the enclosure, the thermal bridge bridging the constricted region and providing a thermal conduction path that is in parallel with a thermal conduction path of the supply terminal, wherein the thermal bridge is non-magnetic and has a thermal conductivity that is higher than a thermal conductivity of the enclosure.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein is an electronic device, such as a molded power semiconductor package or a power semiconductor module, having a supply terminal and associated features that enable the supply terminal to provide both heat dissipation and accurate current measurements during operation of the electronic device. The supply terminal has a constricted region that has a reduced width in a lateral direction relative to the rest of the supply terminal. During operation in which current passes through the supply terminal, higher current density in the constricted region results in a higher magnetic flux produced proximal to the constricted region. The higher magnetic flux near the constricted region of the supply terminal may enable a sensor placed near the constricted region to more accurately measure current through the supply terminal when compared to similar measurements taken elsewhere along the supply terminal where the magnetic flux is lower. However, the narrower constricted region limits the amount of heat energy that can pass through the supply terminal, reducing the efficiency of heat dissipation from the electronic device through the supply terminal.

According to embodiments described herein, the electronic device includes a thermal bridge that provides a thermal conduction path that is in parallel with the thermal conduction path of the supply terminal. The thermal conduction path through the thermal bridge enables heat energy to bypass the constricted region of the supply terminal. Providing a supply terminal having a constricted region and a thermal bridge that provides a thermal conduction path around the constricted region may, in some examples, enable the supply terminal of the electronic device to both dissipate heat away from the electronic device and provide a magnetic flux that is sufficient to enable accurate current measurements to be taken.

Described next, with reference to the figures, are exemplary electronic devices having a supply terminal with a constricted region and a thermal bridge that provides a thermal conduction path around the constricted region.

Figure 1:
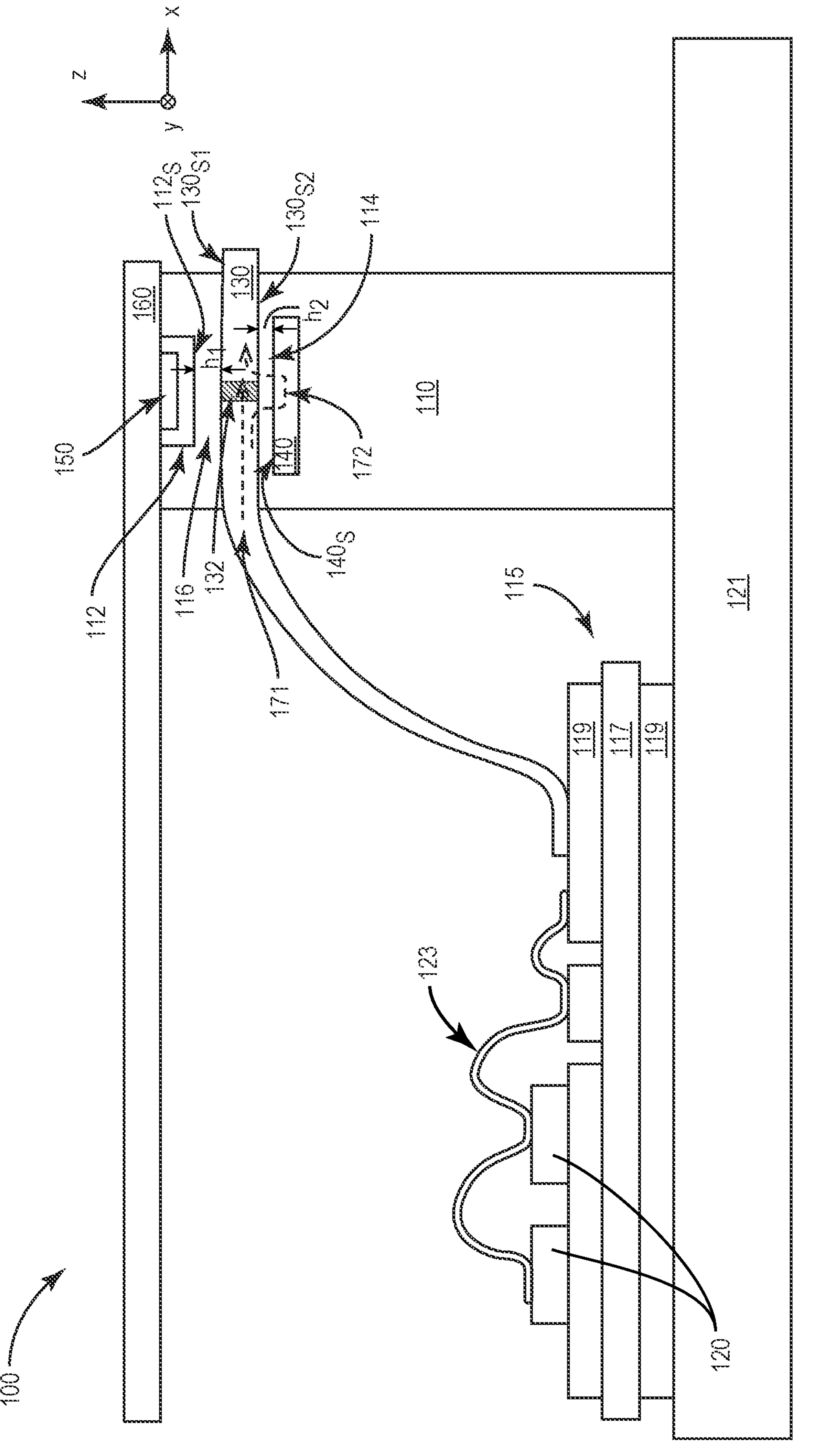
FIG. 1 illustrates a side cross-sectional view of an electronic device, according to an embodiment.

FIG. 1 illustrates a side cross-sectional view of an electronic device 100, according to an embodiment. The electronic device 100 includes one or more power semiconductor dies 120 mounted to a substrate 115 within an enclosure 110.

In some examples, the enclosure 110 is a molded enclosure that includes a mold compound. In these examples, the electronic device 100 may be a molded power semiconductor package and, although not specifically illustrated in FIG. 1, the power semiconductor die(s) 120 may be embedded in the enclosure 110. A mold compound is a plastic encapsulant typically formed from an organic resin such as an epoxy resin. The plastic encapsulant may include fillers such as non-melting inorganic materials. Catalysts may be used to accelerate the cure reaction of the organic resin. Other materials such as flame retardants, adhesion promoters, ion traps, stress relievers, colorants, etc. may be added to the plastic encapsulant, as appropriate. The mold compound may be formed by injection molding, compression molding, film-assisted molding (FAM), reaction injection molding (RIM), resin transfer molding (RTM), blow molding, etc.

In some examples, the enclosure 110 is a frame enclosure. In these examples, the electronic device 100 may be a power semiconductor module. A frame enclosure may include one or more pieces of metal, plastic, composite, and/or other suitable material that is structured and arranged to enclose the power semiconductor die(s) 120. A frame enclosure may include a base, a lid, walls, and/or other pieces. A frame enclosure may include openings that provide access to the power semiconductor die(s) 120, e.g., contact pads. Alternatively, or in addition, a frame enclosure may include feedthrough contacts such as pins or terminals that provide electrical contact to the power semiconductor die(s) 120.

The substrate 115 may be a printed circuit board (PCB), lead frame, or other substrate, e.g., insulated metal substrate (IMS), a DCB (direct copper bonded) substrate, an AMB (active metal brazed), etc. The substrate 115 may include one or more layers 117 of insulating material (e.g. polyimide, ceramic) and one or more metallic layers 119 (e.g., copper, aluminum). The one or more metallic layers 119 may be patterned to provide regions for electrical contact to the power semiconductor die(s) 120. The substrate 115 may be mounted to a cooler 121 such as a natural or forced convection air cooled heat sink, a single or double sided cooling system with liquid cold plates, etc.

In FIG. 1, a bond wire 123 electrically connects the power semiconductor dies 120 (e.g., source contacts of the semiconductor dies 120) to one another and to one of the metallic layers 119 of the substrate 115. In other examples, separate bond wires may be used to contact one or more of the power semiconductor die(s) 120 to one another, to one or more metallic layers 119 of the substrate 115, and/or to another feature of the electronic device 100. In other examples, other electrical connection means, such as a metallic ribbon or ribbons, clip(s), etc., may be used to connect one or more of the power semiconductor die(s) 120 to one another, to one or more metallic layers 119 of the substrate 115, and/or to another feature of the electronic device 100.

The power semiconductor die(s) 120 may include one or more devices, including transistors, diodes, resistors, capacitors, and/or other types of active or passive devices. Examples of transistors of the power semiconductor die(s) 120 may include MOSFETs, IGBTs, and/or BJTs, among others. The power semiconductor die(s) 120 and/or their constituent devices may be arranged to form all or part of a power electronics circuit such as a DC/AC inverter, a DC/DC converter, an AC/DC converter, a DC/AC converter, an AC/AC converter, a multi-phase inverter, an H-bridge, motor driver, etc. In some examples, a power electronics circuit that includes the power semiconductor die(s) 120 is a half-bridge or full-bridge circuit.

The electronic device 100 includes a supply terminal 130 electrically connected to one or more of the power semiconductor die(s) 120, e.g., through one of the metallic layers 119 of the substrate 115. The supply terminal 130 is at least partially exposed from the enclosure 110. In the example of the electronic device 100, the supply terminal 130 extends lengthwise in a longitudinal (current flow) direction x and protrudes from the enclosure 110. In other examples, a surface of the supply terminal 130 may be exposed from the enclosure 110. For example, a surface of the supply terminal 130 may be flush with a surface of the enclosure 110, or may protrude or be recessed from a surface of the enclosure 110. Other configurations in which the supply terminal 130 is at least partially exposed from the enclosure 110 are contemplated. In examples where the power semiconductor die(s) 120 include one or more transistors (e.g. MOSFET(s), IGBT(s), a half bridge or full bridge circuit), the supply terminal 130 may be a source, emitter, drain, or collector terminal.

The supply terminal 130 includes a constricted region 132 where a width of the supply terminal 130 reduces in a lateral direction y transverse to the longitudinal direction x. As current passes through the supply terminal 130 along the longitudinal direction x, the current density increases in the constricted region 132 due to the reduced width relative to the rest of the supply terminal 130. This results in a higher magnetic flux produced proximal to the constricted region 132. The higher magnetic flux near the constricted region 132 of the supply terminal 130 may enable a sensor placed near the constricted region 132 to more accurately measure current through the supply terminal 130 when compared to similar measurements taken elsewhere along the supply terminal 130 where the magnetic flux is lower.

FIG. 1 illustrates an exemplary sensor 150 (e.g., a Hall sensor) that is aligned with the constricted region 132 along a z direction that is orthogonal to both the longitudinal direction x and the lateral direction y. In this example, the enclosure 110 includes a recess 112 that is aligned with the constricted region 132 along the z direction and is configured to receive the sensor 150. The sensor 150 may be attached, e.g., soldered, to a printed circuit board (PCB) 160 (e.g., a gate driver PCB). In other examples, such as a molded enclosure 110, the sensor 150 may be embedded in the enclosure 110. The sensor 150 is included herein for illustrative purposes but is optional and is not a requirement of the electronic device 100.

According to an embodiment, the electronic device 100 includes a thermal bridge 140. The thermal bridge 140 is distinct from the enclosure 110 and is electrically isolated from the supply terminal 130. The thermal bridge 140 thermally bridges the constricted region 132 of the supply terminal 130, providing a thermal conduction path 172 that is in parallel with a thermal conduction path 171 of the supply terminal 130. The thermal conduction path 172 through the thermal bridge 140 enables heat energy to bypass the constricted region 132 of the supply terminal 130, potentially improving heat dissipation from the electronic device 100. Additionally, by channelling dissipated heat through the thermal bridge 140, the temperature of the supply terminal 130 near the constricted region 132 may be reduced, thus potentially reducing the impact of the temperature of the constricted region 132 on the sensor 150 and enabling the sensor 150 to provide more accurate current measurements and/or avoiding excessive heating of the sensor 150.

The thermal bridge 140 is non-magnetic so that the thermal bridge 140 does not affect the magnetic flux around the constricted region 132, and thus the measurement of the current through the supply terminal 130. Additionally, the thermal bridge 140 has a thermal conductivity that is higher than a thermal conductivity of the enclosure 110. For example, the thermal bridge 140 may have a thermal conductivity of at least 20 W/m-K. The thermal bridge 140 may be electrically conductive or electrically insulative since the thermal bridge 140 does not form part of the main current path of the electronic device. In some examples, the thermal bridge 140 is metallic, e.g., comprising copper, aluminum, and/or one or more other metals or metal alloys. The thermal bridge 140 may be formed of a metallic foil. Other example materials of the thermal bridge 140 include a ceramic such as silicon nitride, thermal grease, or a composite material that includes one or more fillers, among other examples.

In FIG. 1, the thermal bridge 140 and the constricted region 132 of the supply terminal 130 are embedded in the enclosure 110. A gap 114 separates the thermal bridge 140 from the supply terminal 130 in the z direction. A portion of the enclosure 110 is disposed in the gap 114, although in some examples a thermal interface material (e.g., a thermal transfer sheet, thermal filler, foil, glue) may additionally or alternatively be disposed in the gap 114. The recess 112 that is configured to receive the sensor 150 is on an opposite side of the supply terminal 130 from the thermal bridge 140. A height $h_1$ of a gap 116 between a lower surface $\mathbf{112}_S$ of the recess 112 and a first main surface $\mathbf{130}_{S1}$ of the supply terminal 130 is greater than a height $h_2$ of the gap 114 between a second, opposite main surface $\mathbf{130}_{S2}$ of the supply terminal 130 and a surface $\mathbf{140}_S$ of the thermal bridge 140 that faces the supply terminal 130.

Figure 2:
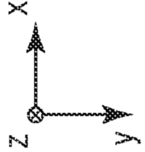
FIG. 2 illustrates a top plan view of a supply terminal and a thermal bridge, according to an embodiment.
Figure 2:
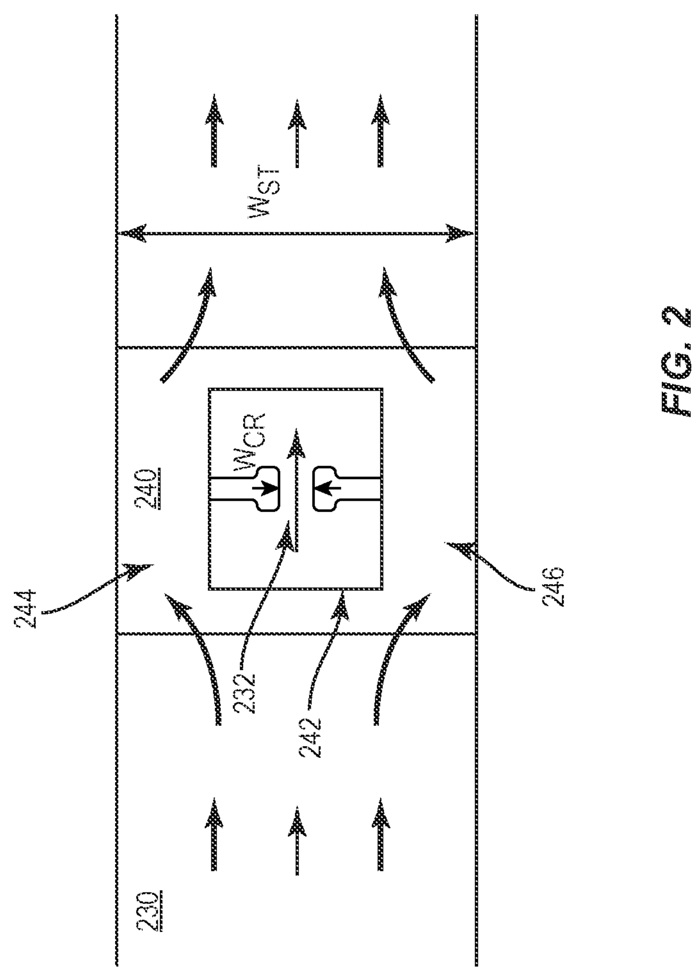

FIG. 2 illustrates a top plan view of a supply terminal 230 and a thermal bridge 240, according to an embodiment. The supply terminal 230, a constricted region 232 of the supply terminal 230, and the thermal bridge 240 are one example of the supply terminal 130, the constricted region 132, and the thermal bridge 140, respectively, of the electronic device 100 of FIG. 1.

A width $W_{ST}$ of the supply terminal 230 reduces to a width $W_{CR}$ in the lateral direction y in the constricted region 232. The thermal bridge 240 bridges the constricted region 232 and includes an opening 242 that is aligned with the constricted region 232 such that the constricted region 232 is uncovered by the thermal bridge 240 in the z direction. Specifically, the thermal bridge 240 includes a first segment 244 that bridges the constricted region 232 along a first side of the constricted region 232 in the longitudinal (current flow) x direction and a second segment 246 that is separated from the first segment 244 in the lateral y direction and bridges the constricted region 232 along a second, opposite side of the constricted region 232 in the longitudinal x direction. The opening 242 is between the first segment 244 and the second segment 246 in the region of the constricted region 232.

Providing the opening 242 in the thermal bridge 240 and aligned with the constricted region 232 may, in some instances, reduce the presence of stray magnetic fields from the thermal bridge 240 (e.g., from Eddy currents generated from proximity of the thermal bridge 240 to the magnetic field of the supply terminal 230) in the vicinity of the constricted region 232. This arrangement may ensure that the magnetic field sensed by a sensor (e.g., the sensor 150 of FIG. 1) in proximity to the constricted region 232 arises predominately from the supply terminal 230 with little or no interference from the thermal bridge 240, enabling the sensor to provide a more accurate measurement of current in the supply terminal 230. Additionally, as the temperature of the thermal bridge 240 increases when dissipating heat from an associated electronic device (e.g., electronic device 100 of FIG. 1), providing the opening 242 may reduce the impact of the temperature of the thermal bridge 240 on the sensor.

Figure 3:
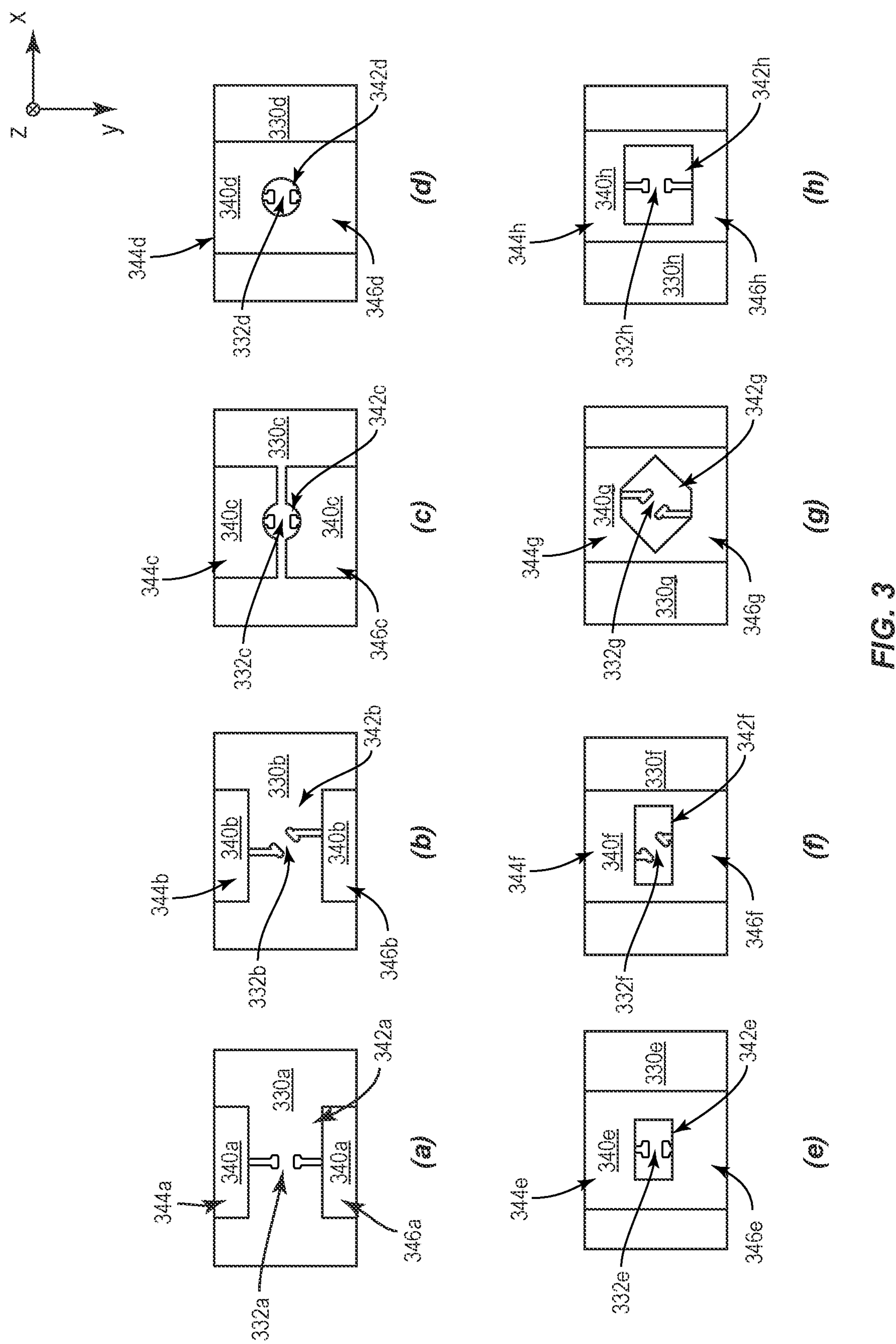
FIG. 3 illustrates top plan views of supply terminals and thermal bridges, according to various embodiments.

FIG. 3 illustrates top plan views of supply terminals 330*a-h* and thermal bridges 340*a-h*, according to various embodiments. The supply terminals 330*a-h*, the constricted regions 332*a-h*, and the thermal bridges 340*a-h* of FIGS. 3*a*-3*h*, respectively, are various examples of the supply terminal 130, the constricted region 132, and the thermal bridge 140, respectively, of the electronic device 100 of FIG. 1, and of the supply terminal 230, the constricted region 232, and the thermal bridge 240, respectively, of FIG. 2.

The examples of FIG. 3 illustrate various orientations of a constricted region of a respective supply terminal. A width of each of the supply terminals 330*a-h* reduces in the lateral direction y in the respective constricted region 332*a-h*. In the examples of the supply terminals 330*a*, 330*c*, 330*d*, 330*e*, and 330*h*, the respective constricted regions 332*a*, 332*c*, 332*d*, 332*e*, and 332*h* are oriented along the longitudinal x direction. In the examples of the supply terminals 330*b*, 330*f*, and 330*g*, the respective constricted regions 332*b*, 332*f*, and 332*g* each include a bend toward the lateral y direction.

Each thermal bridge 340*a-h* bridges a respective constricted region 332*a-h* and includes a respective opening 342*a-h* that is aligned with the respective constricted region 332*a-h* such that the respective constricted region 332*a-h* is uncovered by the respective thermal bridge 340*a-h* in the z direction. Each thermal bridge 340*a-h* includes a respective first segment 344*a-h* that bridges the respective constricted region 332*a-h* along a first side of the respective constricted region 332*a-h* in the longitudinal (current flow) x direction and a respective second segment 346*a-h* that is separated from the respective first segment 344*a-h* in the lateral y direction and bridges the respective constricted region 332*a-h* along a second, opposite side of the respective constricted region 332*a-h* in the longitudinal x direction. The respective opening 342*a-h* is between the respective first segment 344*a-h* and the respective second segment 346*a-h*. In the examples of the thermal bridges 340*a*, 340*b*, and 340*c*, the first segment 344*a*, 344*b*, and 344*c*, respectively, and the second segment 346*a*, 346*b*, and 346*c*, respectively, of the thermal bridge 340*a*, 340*b*, and 340*c*, respectively, are separate pieces.

FIGS. 3*a*-3*h* illustrate only a few example configurations of the supply terminal, the constricted region, and the thermal bridge, according to embodiments of the present disclosure. These examples are not limiting, and other structures, arrangements, orientations, features, etc. of supply terminals, constricted regions, and thermal bridges are contemplated and are within the scope of the present disclosure.

Figure 4:
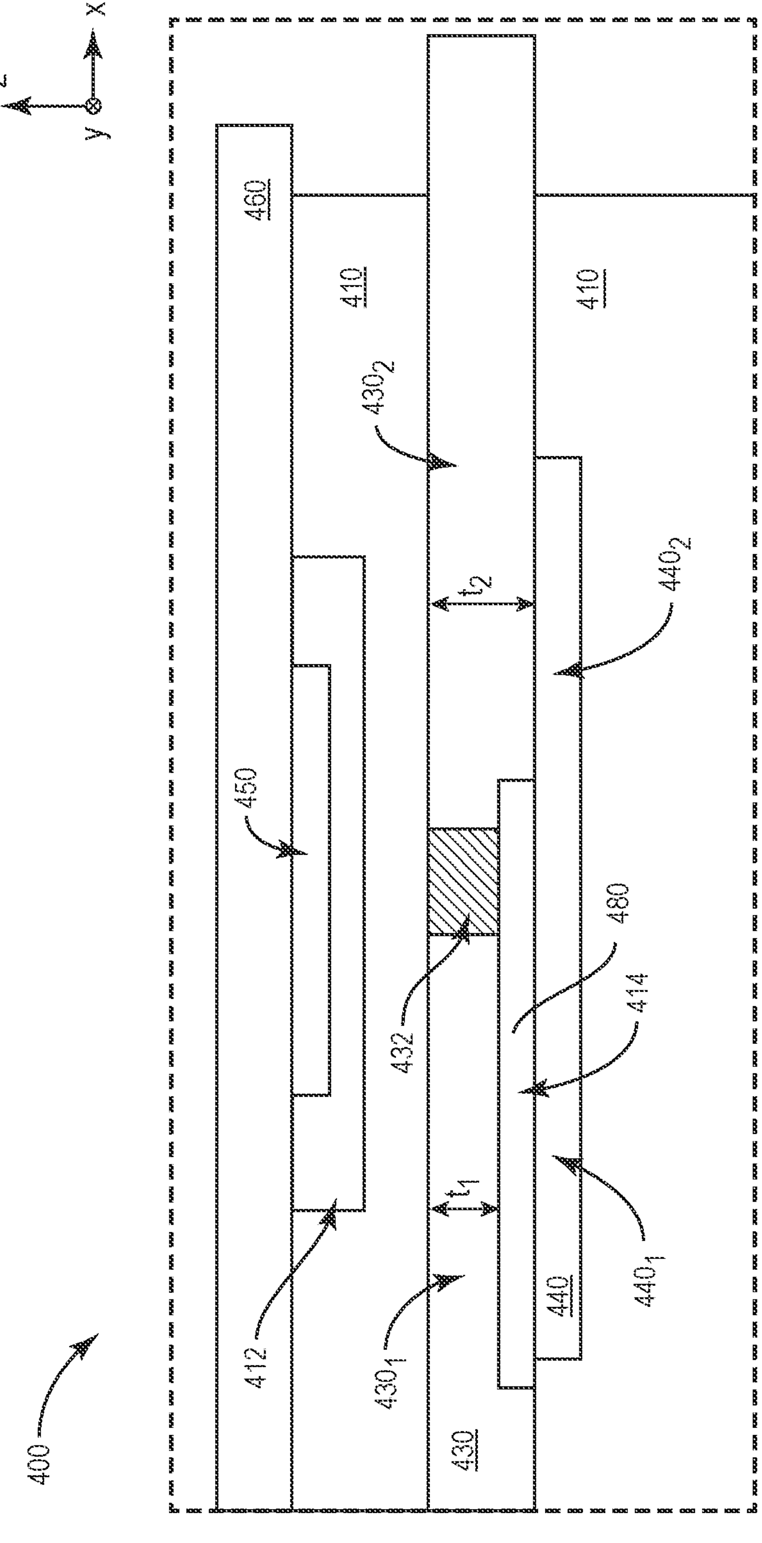
FIG. 4 illustrates a side cross-sectional view of an electronic device, according to an embodiment.

FIG. 4 illustrates a side cross-sectional view of an electronic device 400, according to an embodiment. Unless specifically noted herein, the electronic device 400 may be similar to the electronic device 100 of FIG. 1. Similarities to the electronic device 100 may include structure, composition, function, features, components, dimensions, and/or other attributes of the electronic device 100 and its features.

The electronic device 400 includes an enclosure 410, a supply terminal 430 having a constricted region 432, and a thermal bridge 440 that bridges the constricted region 432 of the supply terminal 430. The enclosure 410 may be similar to the enclosure 110 of FIG. 1. The supply terminal 430 may be electrically connected to one or more power semiconductor dies (e.g., the power semiconductor die(s) 120 of FIG. 1). The supply terminal 430 and the constricted region 432 may be similar to the supply terminal 130 and the constricted region 132 of FIG. 1, the supply terminal 230 and the constricted region 232 of FIG. 2, one of the supply terminals 330*a-h* and the constricted regions 332*a-h* of FIG. 3, or may be different than these. The thermal bridge 440 may be similar to the thermal bridge 140 of FIG. 1, the thermal bridge 240 of FIG. 2, one of the thermal bridges 340*a-h* of FIG. 3, or may be different than these. FIG. 4 illustrates an exemplary sensor 450 that may be similar to the sensor 150 of FIG. 1. The sensor 450 is attached to an exemplary PCB 460 and is aligned with the constricted region 432 along the z direction. The enclosure 410 includes a recess 412 that is configured to receive a sensor, e.g., the sensor 450. The sensor 450, the PCB 460, and the recess 412 are included herein for illustrative purposes but are optional and are not requirements of the electronic device 400.

The electronic device 400 differs from the electronic device 100 of FIG. 1 in that a part of the thermal bridge 440 is attached to the supply terminal 430. Specifically, the supply terminal 430 includes a first portion 430$_1$ and a second portion 430$_2$ on opposite sides of the constricted region 432. A thickness $t_2$ of the second portion 430$_2$ of the supply terminal 430 is greater than a thickness $t_1$ of the first portion 430$_1$ of the supply terminal 430 such that a gap 414 separates a first portion 440$_1$ of the thermal bridge 440 from the first portion 430$_1$ and the constricted region 432 of the supply terminal 430. A second portion 440$_2$ of the thermal bridge 440 is attached to the second portion 430$_2$ of the supply terminal 430. The second portion 440$_2$ of the thermal bridge 440 may be attached to the second portion 430$_2$ of the supply terminal 430 by a thermally conductive material such as an adhesive or glue, or may be soldered, diffusion soldered, welded, brazed, or clinched to the second portion 430$_2$.

In FIG. 4, a material 480 is disposed in the gap 414. The material 480 may be a part of the enclosure 410 (e.g., a mold compound or part of a frame of the enclosure 410), or may be a thermal interface material that is distinct from the enclosure 410, such as a thermal transfer sheet, thermal filler, foil, glue, or other suitable material.

Figure 5:
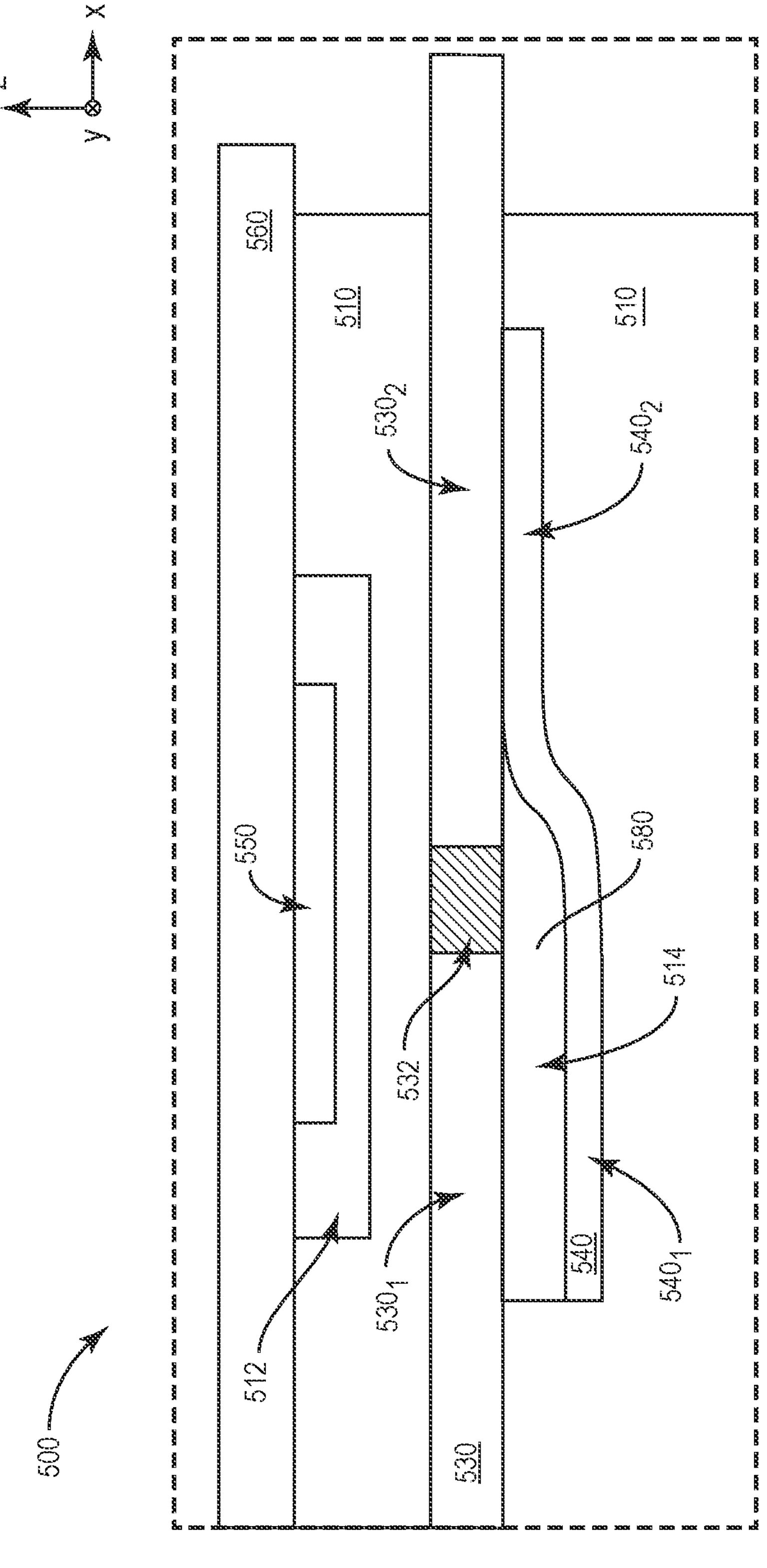
FIG. 5 illustrates a side cross-sectional view of an electronic device, according to an embodiment.

FIG. 5 illustrates a side cross-sectional view of an electronic device 500, according to an embodiment. Unless specifically noted herein, the electronic device 500 may be similar to the electronic device 100 of FIG. 1. Similarities to the electronic device 100 may include structure, composition, function, features, components, dimensions, and/or other attributes of the electronic device 100 and its features.

The electronic device 500 includes an enclosure 510, a supply terminal 530 having a constricted region 532, and a thermal bridge 540 that bridges the constricted region 532 of the supply terminal 530. The enclosure 510 may be similar to the enclosure 110 of FIG. 1. The supply terminal 530 may be electrically connected to one or more power semiconductor dies (e.g., the power semiconductor die(s) 120 of FIG. 1). The supply terminal 530 and the constricted region 532 may be similar to the supply terminal 130 and the constricted region 132 of FIG. 1, the supply terminal 230 and the constricted region 232 of FIG. 2, one of the supply terminals 330*a-h* and the constricted regions 332*a-h* of FIG. 3, or may be different than these. The thermal bridge 540 may be similar to the thermal bridge 140 of FIG. 1, the thermal bridge 240 of FIG. 2, one of the thermal bridges 340*a-h* of FIG. 3, or may be different than these. FIG. 5 illustrates an exemplary sensor 550 that may be similar to the sensor 150 of FIG. 1. The sensor 550 is attached to an exemplary PCB 560 and is aligned with the constricted region 532 along the z direction. The enclosure 510 includes a recess 512 that is configured to receive a sensor, e.g., the sensor 550. The sensor 550, the PCB 560, and the recess 512 are included herein for illustrative purposes but are optional and are not requirements of the electronic device 500.

The electronic device 500 differs from the electronic device 100 of FIG. 1 in that a part of the thermal bridge 540 is attached to the supply terminal 530. Specifically, the supply terminal 530 includes a first portion 530$_1$ and a second portion 530$_2$ on opposite sides of the constricted region 532. The supply terminal 530 has a bend between the first portion 530$_1$ and the second portion 530$_2$ such that a gap 514 separates a first portion 540$_1$ of the thermal bridge 540 from the first portion 530$_1$ and the constricted region 532 of the supply terminal 530. A second portion 540$_2$ of the thermal bridge 540 is attached to the second portion 530$_2$ of the supply terminal 530. The second portion 540$_2$ of the thermal bridge 540 may be attached to the second portion 530$_2$ of the supply terminal 530 by a thermally conductive material such as an adhesive or glue, or may be soldered, diffusion soldered, welded, brazed, or clinched to the second portion 530$_2$.

In FIG. 5, a material 580 is disposed in the gap 514. The material 580 may be a part of the enclosure 510 (e.g., a mold compound or part of a frame of the enclosure 510), or may be a thermal interface material that is distinct from the enclosure 510, such as a thermal transfer sheet, thermal filler, foil, glue, or other suitable material.

Figure 6:
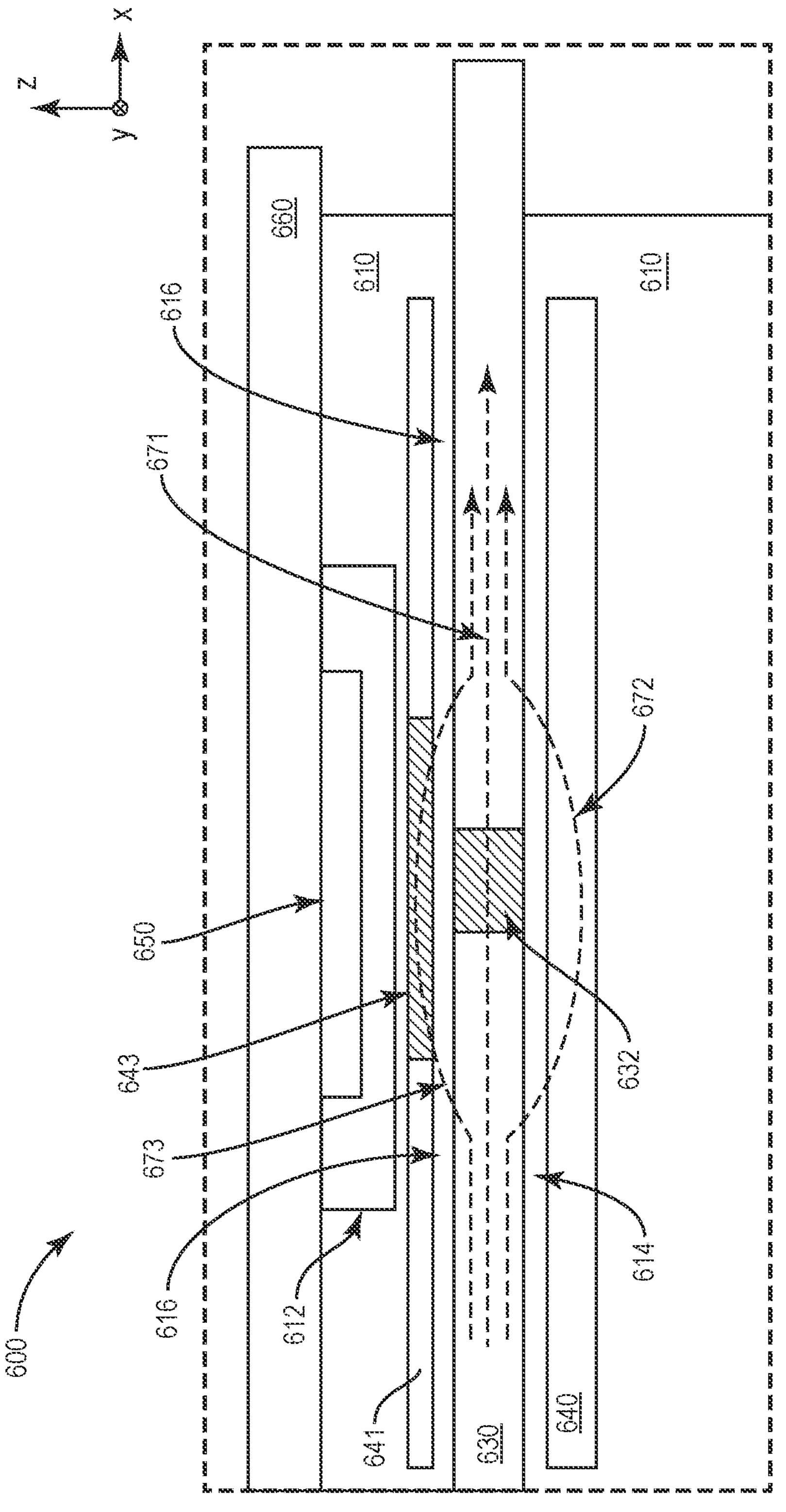
FIG. 6 illustrates a side cross-sectional view of an electronic device, according to an embodiment.

FIG. 6 illustrates a side cross-sectional view of an electronic device 600, according to an embodiment. Unless specifically noted herein, the electronic device 600 may be similar to the electronic device 100 of FIG. 1. Similarities to electronic device 100 may include structure, composition, function, features, components, dimensions, and/or other attributes of the electronic device 100 and its features.

The electronic device 600 includes an enclosure 610, a supply terminal 630 having a constricted region 632, and a first thermal bridge 640 on a first side of the supply terminal 630. The first thermal bridge 640 bridges the constricted region 632 of the supply terminal 630 and provides a first thermal conduction path 672 that is in parallel with a thermal conduction path 671 of the supply terminal 630. The enclosure 610 may be similar to the enclosure 110 of FIG. 1. The supply terminal 630 may be electrically connected to one or more power semiconductor dies (e.g., power semiconductor die(s) 120 of FIG. 1). The supply terminal 630 and the constricted region 632 may be similar to the supply terminal 130 and the constricted region 132 of FIG. 1, the supply terminal 230 and the constricted region 232 of FIG. 2, one of the supply terminals 330*a-h* and the constricted regions 332*a-h* of FIG. 3, or may be different than these. The first thermal bridge 640 may be similar to the thermal bridge 140 of FIG. 1, the thermal bridge 240 of FIG. 2, one of the thermal bridges 340*a-h* of FIG. 3, or may be different than these. FIG. 6 illustrates an exemplary sensor 650 that may be similar to the sensor 150 of FIG. 1. The sensor 650 is attached to an exemplary PCB 660 is aligned with the constricted region 632 along the z direction. The enclosure 610 includes a recess 612 that is configured to receive a sensor, e.g., the sensor 650. The sensor 650, the PCB 660, and the recess 612 are included herein for illustrative purposes but are optional and are not requirements of the electronic device 600.

The electronic device 600 differs from the electronic device 100 in that it includes a second thermal bridge 641 that is distinct from the enclosure 610 and is on a second, opposite side of the supply terminal 632 from the first thermal bridge 640. The second thermal bridge 641 bridges the constricted region 632 and provides a second thermal conduction path 673 that is in parallel with the thermal conduction path 671 of the supply terminal 630. A first gap 614 separates the first thermal bridge 640 from the supply terminal 630 and a second gap 616 separates the second thermal bridge 641 from the supply terminal 630. In FIG. 6, the first gap 614 and the second gap 616 each include a portion of the enclosure 610. In other examples, one or both of the first gap 614 and/or the second gap 616 may include a thermal interface material that is distinct from the enclosure 610 (e.g., a thermal transfer sheet, thermal filler, foil, glue, etc.).

The second thermal bridge 641 includes an opening 643 that is aligned with the constricted region 632 along the z direction. The opening 643 of the second thermal bridge 641 may be aligned with an opening of the first thermal bridge 640 along the z direction.

The second thermal bridge 641 is non-magnetic and has a thermal conductivity that is higher than a thermal conductivity of the enclosure 610. The structure, composition, features, and dimensions, e.g., shape and dimensions of the opening 643, and/or other attributes of the second thermal bridge 641 may be similar to those of other thermal bridges described herein, e.g., the thermal bridge 140 of FIG. 1, the thermal bridge 240 of FIG. 2, one of the thermal bridges 340*a-h* of FIG. 3, the first thermal bridge 640 of FIG. 6, or may be different than these.

While the first thermal bridge 640 and the second thermal bridge 641 of this example are separated from the supply terminal 630, examples in which at least part of the first thermal bridge 640 and/or the second thermal bridge 641 is attached to the supply terminal 630 are contemplated, similar to the examples of the thermal bridges 440 and 540 illustrated in FIGS. 4 and 5, respectively.

Figure 7:
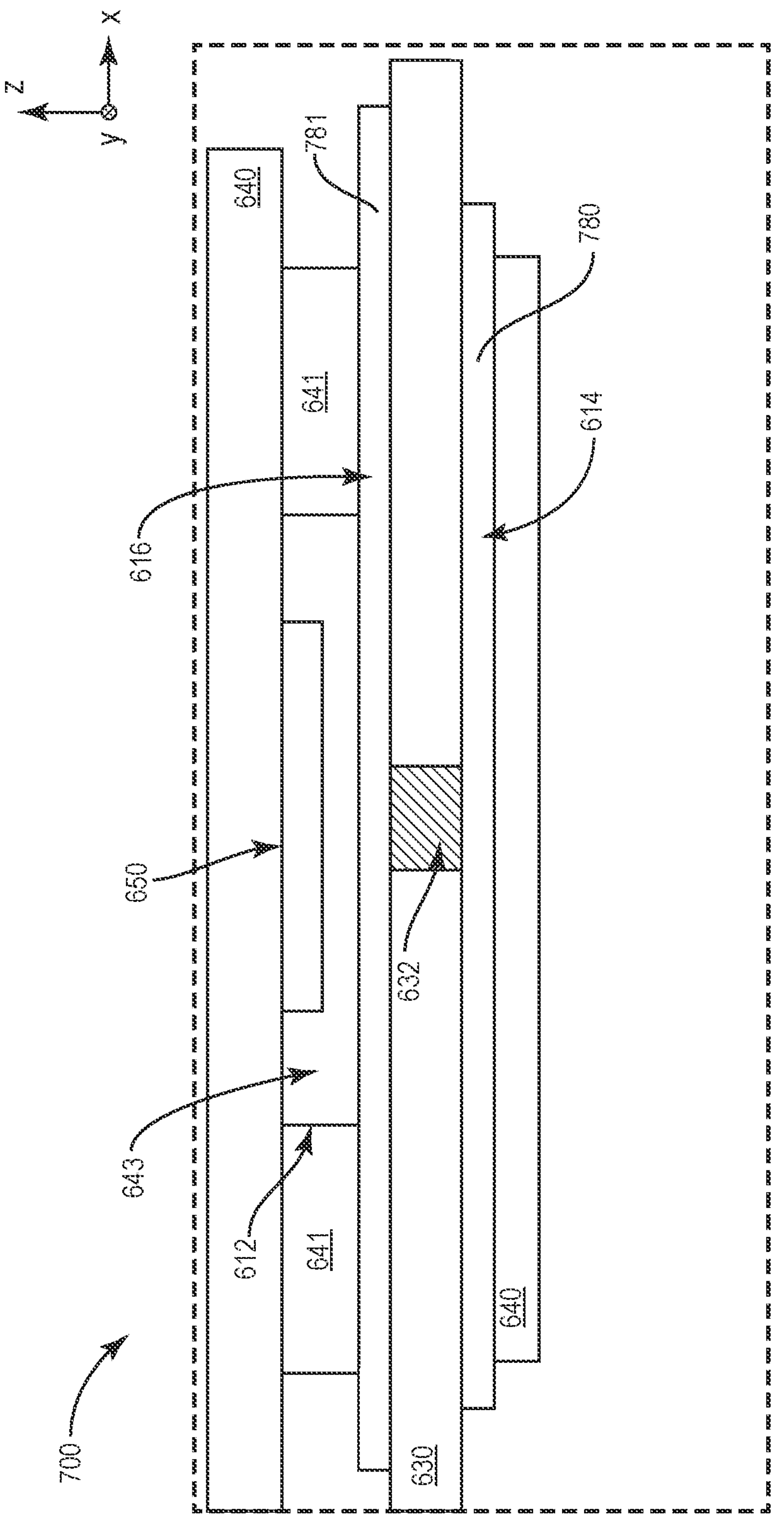
FIG. 7 illustrates a side cross-sectional view of an electronic device, according to an embodiment.

FIG. 7 illustrates a side cross-sectional view of an electronic device 700, according to an embodiment. FIG. 7 illustrates an alternative arrangement of the electronic device 600 of FIG. 6. The features illustrated in FIG. 7 are similar to the correspondingly numbered features illustrated in FIG. 6. The electronic device 700 of FIG. 7 differs from the electronic device 600 of FIG. 6 in that the recess 612 extends at least partly through the opening 643 such that the second thermal bridge 641 surrounds the recess 612. Additionally, thermal interface materials 780 and 781 may be disposed in the first gap 614 and/or the second gap 616, respectively. Each of the thermal interface materials 780 and 781 may be a thermal transfer sheet, thermal filler, foil, glue, or other suitable material. In other examples, one or both of the first gap 614 and/or the second gap 616 may be partially or completely filled with a portion of an enclosure (e.g., the enclosure 610 of FIG. 6). In some examples, first thermal bridge 640, second thermal bridge 641, the constricted region 632 of the supply terminal 630, and the thermal interface materials 780 and 781 are partially or completely outside of an enclosure of the electronic device 700 (e.g., the enclosure 610 of FIG. 6).

Figure 8:
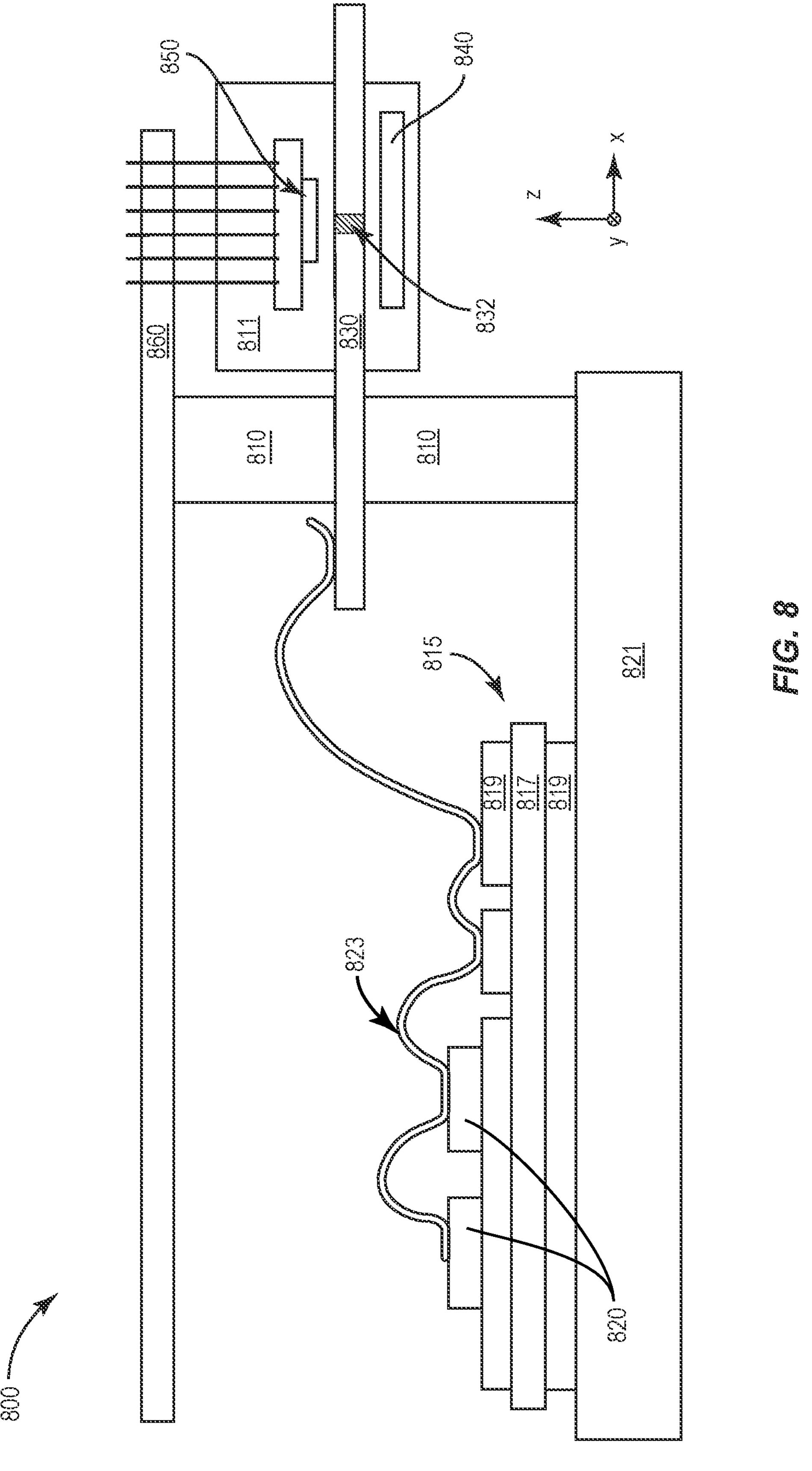
FIG. 8 illustrates a side cross-sectional view of an electronic device, according to an embodiment.

FIG. 8 illustrates a side cross-sectional view of an electronic device 800, according to an embodiment. Unless specifically noted herein, the electronic device 800 may be similar to the electronic device 100 of FIG. 1. Similarities to electronic device 100 may include structure, composition, function, features, components, dimensions, and/or other attributes of the electronic device 100 and its features.

The electronic device 800 includes one or more power semiconductor dies 820 attached to a substrate 815 within an enclosure 810, a supply terminal 830 having a constricted region 832, and a thermal bridge 840. The supply terminal 830 is electrically connected to one or more of the power semiconductor die(s) 820. The first thermal bridge 840 bridges the constricted region 832 of the supply terminal 830.

The enclosure 810 may be similar to the enclosure 110 of FIG. 1. The substrate 815 may be similar to the substrate 115 of FIG. 1. The substrate 815 may include one or more layers 817 of insulating material (e.g. polyimide, ceramic) and one or more metallic layers 819 (e.g., copper, aluminum). The layers 817 and 819 may be similar to the layers 117 and 119, respectively, of FIG. 1. The substrate 815 may be mounted to a cooler 821. The cooler 821 may be similar to the cooler 121 of FIG. 1. A bond wire 823 electrically connects the power semiconductor dies 820 (e.g., source contacts of the semiconductor dies 820) to one another and to one of the metallic layers 819 of the substrate 815. As in the example of electronic device 100 of FIG. 1, other examples may include separate bond wires to contact one or more of the power semiconductor die(s) 820 to one another, to one or more metallic layers 819 of the substrate 815, and/or to another feature of the electronic device 800, and/or may include other electrical connection means, such as a metallic ribbon or ribbons, clip(s), etc., to connect one or more of the power semiconductor die(s) 820 to one another, to one or more metallic layers 819 of the substrate 815, and/or to another feature of the electronic device 800.

The power semiconductor die(s) 820 may be similar to the power semiconductor die(s) 120 of FIG. 1. The supply terminal 830 and the constricted region 832 may be similar to the supply terminal 130 and the constricted region 132 of FIG. 1, the supply terminal 230 and the constricted region 232 of FIG. 2, one of the supply terminals 330*a-h* and the constricted regions 332*a-h* of FIG. 3, or may be different than these. The thermal bridge 840 may be similar to the thermal bridge 140 of FIG. 1, the thermal bridge 240 of FIG. 2, one of the thermal bridges 340*a-h* of FIG. 3, or may be different than these. While the thermal bridge 840 of this example is separated from the supply terminal 830, examples in which at least part of the thermal bridge 840 is attached to the supply terminal 830 are contemplated, similar to the examples of the thermal bridges 440 and 540 illustrated in FIGS. 4 and 5, respectively. Additionally, examples in which a thermal interface material (e.g., a thermal transfer sheet, thermal filler, foil, glue) is disposed in a gap between the thermal bridge 840 and the supply terminal 830 are contemplated, e.g., as shown in FIGS. 4, 5 and 7.

FIG. 8 illustrates an exemplary sensor 850 that may be similar to the sensor 150 of FIG. 1. The sensor 850 is aligned with the constricted region 832 along the z direction. The sensor 850 may be electrically coupled to a printed circuit board (PCB) 860 (e.g., a gate driver PCB). The sensor 850 is included herein for illustrative purposes but is optional and is not a requirement of the electronic device 800.

The electronic device 800 differs from the electronic device 100 in that the enclosure 810 encloses the one or more power semiconductor dies 820 and a separate electrically insulative body 811 encloses the thermal bridge 840, the constricted region 832 of the supply terminal 830, and the sensor 850 (if present). In some examples, the separate electrically insulative body 811 is a molded enclosure that includes a mold compound.

Although the present disclosure is not so limited, the following numbered examples demonstrate one or more aspects of the disclosure.

Example 1. An electronic device, comprising: an enclosure; one or more power semiconductor dies within the enclosure; a supply terminal electrically connected to the one or more power semiconductor dies and at least partially exposed from the enclosure, the supply terminal extending lengthwise in a longitudinal direction and comprising a constricted region where a width of the supply terminal reduces in a lateral direction transverse to the longitudinal direction; and a thermal bridge distinct from the enclosure, the thermal bridge bridging the constricted region and providing a thermal conduction path that is in parallel with a thermal conduction path of the supply terminal, wherein the thermal bridge is non-magnetic and has a thermal conductivity that is higher than a thermal conductivity of the enclosure.

Example 2: The electronic device of example 1, wherein the thermal bridge comprises an opening that is aligned with the constricted region such that the constricted region is uncovered by the thermal bridge in a direction that is orthogonal to both the longitudinal direction and the lateral direction.

Example 3: The electronic device of example 1 or 2, wherein the thermal bridge comprises a first segment that bridges the constricted region along a first side of the constricted region in the longitudinal direction and a second segment that is separated from the first segment in the lateral direction and bridges the constricted region along a second, opposite side of the constricted region in the longitudinal direction.

Example 4: The electronic device of any of examples 1 through 3, wherein the first segment and the second segment of the thermal bridge are separate pieces.

Example 5. The electronic device of any of examples 1 through 4, wherein the thermal bridge is embedded in the enclosure.

Example 6. The electronic device of any of examples 1 through 5, wherein the thermal bridge is metallic.

Example 7. The electronic device of any of examples 1 through 6, wherein the thermal bridge is electrically isolated from the supply terminal.

Example 8. The electronic device of any of examples 1 through 7, wherein a gap separates at least a portion of the thermal bridge from the supply terminal in a direction that is orthogonal to both the longitudinal direction and the lateral direction.

Example 9. The electronic device of any of examples 1 through 8, wherein a portion of the enclosure is disposed in the gap.

Example 10. The electronic device of any of examples 1 through 9, wherein a thermal interface material distinct from the enclosure is disposed in the gap.

Example 11. The electronic device of any of examples 1 through 6 or 8 through 10, wherein the supply terminal comprises a first portion and a second portion on opposite sides of the constricted region, wherein the gap separates a first portion of the thermal bridge from the first portion of the supply terminal, and wherein a second portion of the thermal bridge is attached to the second portion of the supply terminal.

Example 12: The electronic device of example 11, wherein a thickness of the second portion of the supply terminal is greater than a thickness of the first portion of the supply terminal.

Example 13. The electronic device of any of examples 1 through 6 or 8 through 12, wherein at least a part of the thermal bridge is attached to the supply terminal.

Example 14. The electronic device of any of examples 1 through 13, wherein the enclosure comprises a recess that is configured to receive a sensor, and wherein the recess is on an opposite side of the supply terminal from the thermal bridge and is aligned with the constricted region along a direction that is orthogonal to both the longitudinal direction and the lateral direction.

Example 15. The electronic device of example 14, wherein a height of a first gap between a lower surface of the recess and a first main surface of the supply terminal is greater than a height of a second gap between a second, opposite main surface of the supply terminal and a surface of the thermal bridge that faces the supply terminal.

Example 16. The electronic device of any of examples 1 through 15, wherein the thermal bridge is a first thermal bridge on a first side of the supply terminal, wherein the thermal conduction path provided by the first thermal bridge is a first thermal conduction path, and wherein the electronic device further comprises a second thermal bridge on a second, opposite side of the supply terminal from the first thermal bridge, wherein the second thermal bridge is distinct from the enclosure, the second thermal bridge bridging the constricted region and providing a second thermal conduction path that is in parallel with the thermal conduction path of the supply terminal, and wherein the second thermal bridge is non-magnetic and has a thermal conductivity that is higher than a thermal conductivity of the enclosure.

Example 17. The electronic device of any of examples 1 through 16, wherein a first gap separates at least a portion of the first thermal bridge from the supply terminal, and wherein a second gap separates at least a portion of the second thermal bridge from the supply terminal.

Example 18. The electronic device of any of examples 1 through 17, wherein a thermal interface material distinct from the enclosure is disposed in at least one of the first gap or the second gap.

Example 19. The electronic device of any of examples 1 through 18, wherein the second thermal bridge comprises an opening that is aligned with the constricted region along a direction that is orthogonal to both the longitudinal direction and the lateral direction, and wherein the enclosure comprises a recess that is configured to receive a sensor, the recess extending at least partly through the opening such that the second thermal bridge surrounds the recess.

Example 20. The electronic device of any of examples 1 through 19, further comprising a sensor that is that is aligned with the constricted region along a direction that is orthogonal to both the longitudinal direction and the lateral direction.

Example 21. The electronic device of any of examples 1 through 20, wherein the thermal bridge, the constricted region of the supply terminal, and the sensor are embedded in the enclosure.

Example 22. The electronic device of any of examples 1 through 4 or 6 through 20, wherein the enclosure encloses the one or more power semiconductor dies, and wherein the electronic device further comprises a separate electrically insulative body enclosing the thermal bridge, the constricted region of the supply terminal, and the sensor.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The expression "and/or" should be interpreted to include all possible conjunctive and disjunctive combinations, unless expressly noted otherwise. For example, the expression "A and/or B" should be interpreted to mean only A, only B, or both A and B. The expression "at least one of" should be interpreted in the same manner as "and/or", unless expressly noted otherwise. For example, the expression "at least one of A and B" should be interpreted to mean only A, only B, or both A and B.

It is to be understood that the features of the various embodiments described herein can be combined with each other, unless specifically noted otherwise.

Although specific embodiments have been illustrated and described herein, it will be appreciated by those of ordinary skill in the art that a variety of alternate and/or equivalent implementations can be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic device, comprising:

an enclosure;

one or more power semiconductor dies within the enclosure;

a supply terminal electrically connected to the one or more power semiconductor dies and at least partially exposed from the enclosure, the supply terminal extending lengthwise in a longitudinal direction and comprising a constricted region where a width of the supply terminal reduces in a lateral direction transverse to the longitudinal direction; and a thermal bridge distinct from the enclosure, the thermal bridge bridging the constricted region and providing a thermal conduction path that is in parallel with a thermal conduction path of the supply terminal, wherein the thermal bridge is non-magnetic and has a thermal conductivity that is higher than a thermal conductivity of the enclosure.

2. The electronic device of claim 1, wherein the thermal bridge comprises an opening that is aligned with the constricted region such that the constricted region is uncovered by the thermal bridge in a direction that is orthogonal to both the longitudinal direction and the lateral direction.

3. The electronic device of claim 1, wherein the thermal bridge comprises a first segment that bridges the constricted region along a first side of the constricted region in the longitudinal direction and a second segment that is separated from the first segment in the lateral direction and bridges the constricted region along a second, opposite side of the constricted region in the longitudinal direction.

4. The electronic device of claim 3, wherein the first segment and the second segment of the thermal bridge are separate pieces.

5. The electronic device of claim 1, wherein the thermal bridge is embedded in the enclosure.

6. The electronic device of claim 1, wherein the thermal bridge is metallic.

7. The electronic device of claim 1, wherein the thermal bridge is electrically isolated from the supply terminal.

8. The electronic device of claim 1, wherein a gap separates at least a portion of the thermal bridge from the supply terminal in a direction that is orthogonal to both the longitudinal direction and the lateral direction.

9. The electronic device of claim 8, wherein a portion of the enclosure is disposed in the gap.

10. The electronic device of claim 8, wherein a thermal interface material distinct from the enclosure is disposed in the gap.

11. The electronic device of claim 8, wherein the supply terminal comprises a first portion and a second portion on opposite sides of the constricted region, wherein the gap separates a first portion of the thermal bridge from the first portion of the supply terminal, and wherein a second portion of the thermal bridge is attached to the second portion of the supply terminal.

12. The electronic device of claim 11, wherein a thickness of the second portion of the supply terminal is greater than a thickness of the first portion of the supply terminal.

13. The electronic device of claim 1, wherein at least a part of the thermal bridge is attached to the supply terminal.

14. The electronic device of claim 1, wherein the enclosure comprises a recess that is configured to receive a sensor, and wherein the recess is on an opposite side of the supply terminal from the thermal bridge and is aligned with the constricted region along a direction that is orthogonal to both the longitudinal direction and the lateral direction.

15. The electronic device of claim 14, wherein a height of a first gap between a lower surface of the recess and a first main surface of the supply terminal is greater than a height of a second gap between a second, opposite main surface of the supply terminal and a surface of the thermal bridge that faces the supply terminal.

16. The electronic device of claim 1, wherein the thermal bridge is a first thermal bridge on a first side of the supply terminal, wherein the thermal conduction path provided by the first thermal bridge is a first thermal conduction path, and wherein the electronic device further comprises a second thermal bridge on a second, opposite side of the supply terminal from the first thermal bridge, wherein the second thermal bridge is distinct from the enclosure, the second thermal bridge bridging the constricted region and providing a second thermal conduction path that is in parallel with the thermal conduction path of the supply terminal, and wherein the second thermal bridge is non-magnetic and has a thermal conductivity that is higher than a thermal conductivity of the enclosure.

17. The electronic device of claim 16, wherein a first gap separates at least a portion of the first thermal bridge from the supply terminal, and wherein a second gap separates at least a portion of the second thermal bridge from the supply terminal.

18. The electronic device of claim 17, wherein a thermal interface material distinct from the enclosure is disposed in at least one of the first gap or the second gap.

19. The electronic device of claim 16, wherein the second thermal bridge comprises an opening that is aligned with the constricted region along a direction that is orthogonal to both the longitudinal direction and the lateral direction.

20. The electronic device of claim 1, further comprising a sensor that is that is aligned with the constricted region along a direction that is orthogonal to both the longitudinal direction and the lateral direction.

21. The electronic device of claim 20, wherein the thermal bridge, the constricted region of the supply terminal, and the sensor are embedded in the enclosure.

22. The electronic device of claim 20, wherein the enclosure encloses the one or more power semiconductor dies, and wherein the electronic device further comprises a separate electrically insulative body enclosing the thermal bridge, the constricted region of the supply terminal, and the sensor.

* * * * *